(12) United States Patent
Samah et al.

(10) Patent No.: US 10,025,884 B1
(45) Date of Patent: Jul. 17, 2018

(54) MANIPULATION TOOL FOR OFFSET SURFACE OF A SIMULATION MODEL

(71) Applicant: MSC.Software Corporation, Newport Beach, CA (US)

(72) Inventors: Michel Samah, Costa Mesa, CA (US); James Harvey Leedom, Columbus, NJ (US)

(73) Assignee: MSC.Software Corporation, Newport Beach, CA (US)

( * ) Notice: Subject to any disclaimer, the term of this patent is extended or adjusted under 35 U.S.C. 154(b) by 905 days.

(21) Appl. No.: 14/446,226

(22) Filed: Jul. 29, 2014

(51) Int. Cl.
  *G06F 17/50* (2006.01)

(52) U.S. Cl.
  CPC .......... *G06F 17/50* (2013.01); *G06F 17/5018* (2013.01)

(58) Field of Classification Search
  CPC .......... G06F 17/50; G06T 11/40; G06T 17/20; G06T 19/00
  USPC ............................... 345/419, 420, 441; 703/1
  See application file for complete search history.

(56) References Cited

U.S. PATENT DOCUMENTS

| 7,969,435 B1* | 6/2011 | DeSimone | ............. G06T 19/20 345/419 |
| 2014/0067106 A1* | 3/2014 | Makeig | .................. G06F 17/50 700/98 |

\* cited by examiner

*Primary Examiner* — Andy Ho
(74) *Attorney, Agent, or Firm* — Foley & Lardner LLP

(57) ABSTRACT

Embodiments are directed to a method for receiving a user selection of a first object of a simulated model and selecting a second object of the simulated model based on the received selection of the first object. The method includes generating an offset object similar to the first object, wherein the position of the offset object is based on the position of the first object and second object. The method includes generating a manipulation tool configured to allow a user to change the position of the offset object relative to the first object and second object. The method further includes generating a manipulation tool. The manipulation tool allows a user to change the position of the offset object relative to the first and second objects. The manipulation tool includes a first marker and a second marker associated with the first and second objects, one or more third markers that may or may not be associated with the offset object.

22 Claims, 13 Drawing Sheets

US 10,025,884 B1

MANIPULATION TOOL FOR OFFSET SURFACE OF A SIMULATION MODEL

BACKGROUND

The present disclosure relates generally to finite element methods (FEM) and systems. More particularly, the present disclosure relates to generation and manipulation of an offset surface of a simulation model (e.g., geometric model, finite element model or another type of model).

SUMMARY

Embodiments include a method for receiving a user selection of a first object of a simulated model and selecting a second object of the simulated model based on the received selection of the first object. The method includes generating an offset object similar to the first object, wherein the position of the offset object is based on the position of the first object and second object. The method includes generating a manipulation tool configured to allow a user to change the position of the offset object relative to the first object and second object. The method further includes generating a manipulation tool. The manipulation tool allows a user to change the position of the offset surface relative to the first and second entities. The manipulation tool includes a first marker and second marker associated with the first and second objects, one or more third markers that may or may not be associated with the offset object.

Another embodiment includes a system, with a processing circuit configured to receive a user selection of a first object in a simulated model, select a second object of the simulated model based on the received selection of the first object, and generate an offset object that is similar to the first object. The system includes the position of the offset surface is based on the position of the first object and second object and generate a manipulation tool configured to allow a user to change the position of the offset surface relative to the first entity and second entity.

Another embodiment relates to a method for generating an offset surface for a simulated model and a manipulation tool for the offset surface. The method includes receiving a user selection of a first geometric face in a simulated model and the system configured to selecting a second geometric face of the simulated model based on the received selection of the first geometric face. The method further includes generating an offset surface geometrically similar to the first geometric face, wherein the position of the offset surface is based on the position of the first geometric face and second geometric face. The method further includes generating a manipulation tool configured to allow a user to change the position of the offset surface relative to the first geometric face and second geometric face. The manipulation tool includes a first marker associated with the first geometric face and a second marker associated with the second geometric face. The manipulation tool further includes one or more third markers associated with the offset surface and a user input form. The first marker and second marker are aligned with the first geometric face and second geometric face, respectively, and are controllable by a user to adjust the position of the manipulation tool. The one or more third markers are controllable by a user to adjust the position of the offset surface. In other embodiments, the one or more third market are configured to adjust their position relative to the manipulator's length and thus can be controlled indirectly in additional to being controllable by the user. In various embodiments, the markers have a relationship or are configured to maintain a relationship with the manipulator as well as an association with the one or more surfaces. The one or more third markers may or may not be aligned or associated with the offset surface.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
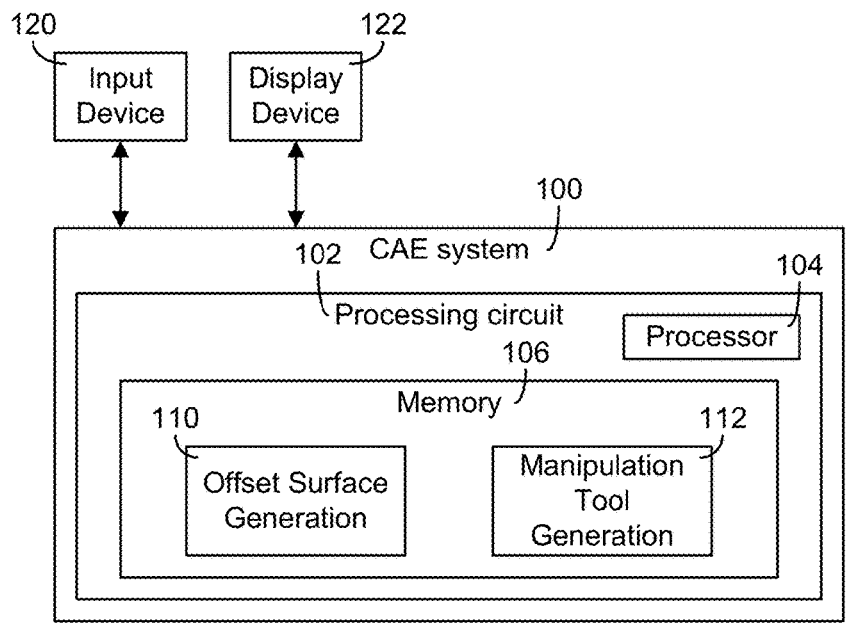
FIG. 1 is a block diagram of a data processing system for use with the systems and methods of the present disclosure, according to an exemplary embodiment.

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Referring generally to the figures, a method and tool for generating an offset surface (i.e., a midsurface) of a simulation model (e.g., geometric model, finite element model or another type of model), and a manipulation tool for the offset surface, is shown and described. The offset surface is generated from an existing single geometrical face of the simulation model or a set of solid geometrical faces from the simulation model. The offset surface may be positioned in the simulation model based on the position of the faces the offset surface was generated from, as well as the position of an opposing face or set of faces. A user of the computer-aided drawing (CAD) or a computer-aided engineering (CAE) system may select one or more geometric faces of the simulation model for the offset surface generation. An opposing face or set of faces may be determined by the system, and an offset surface is generated and positioned relative to the selected and opposing faces.

Although this disclosure refers to a surface (first, second, third or offset surface), each reference to a surface may include any object that is a finite element entity or a geometric object, in various embodiments. Creating a similar object includes creating the offset object that is equal in size, shape or other related properties to the object.

The systems and methods described herein further allows for the manipulation of the generated offset surface. A manipulation tool is generated by the CAD or CAE systems that allow a user to interact with the offset surface. The manipulation tool may generally include a first end marker associated with the selected first geometric face, a second end marker associated with another geometric face of the simulation model, and one or more third markers associated with the offset surface as well as the manipulator. The manipulation tool may further include other interface elements that allow the user to manipulate the offset surface.

In various embodiments, the second end marker of the manipulation tool may or may not be associated with the opposing face to the selected first geometric face. For example, when the manipulation tool is first generated, the second end marker may be by default associated with the opposing geometric face. However, the user may select and drag the second end marker, allowing the user to select another geometric entity of the simulation model as an opposing face to the selected first geometric face.

The various markers of the manipulation tool are associated with a surface or geometric face as described above. In various embodiments, the markers may be lying on a zero dimensional, one dimensional, two dimensional, three dimensional geometries or finite element entity, or may not be visibly attached to the face but may be aligned with the face instead. Each marker may be selected and dragged by a user to allow the user to change the position of the offset surface, to select a different zero dimensional, one dimensional, two dimensional, three dimensional geometries or finite element entity, or to select a different geometric face.

For example, responsive to the user selecting an offset marker (e.g., a marker associated with the offset surface), the position of the offset surface may change, in one embodiment. In other embodiments, in addition to the user performing the direct offset using the market, the surface and the offset surface can offset indirectly via actions performed on the manipulator because of the relationship the market and the offset surface have with the manipulator and/or the other marks. The user may drag the marker up or down along the manipulation tool, and the position of the offset surface may change to correspond with the location of the marker on the manipulation tool. Each marker may generally be dragged, relocated in space, snapped to targets of all dimensions, and have different degrees of freedom based on the situation. The markers may or may not remain constrained to travel along the surfaces of the geometrical faces, and the opposing face and offset surface may react accordingly to such movement based on its association with the manipulation tool.

Referring to FIG. 1, a block diagram of a data processing system is shown, according to an exemplary embodiment. The data processing system generally includes a CAD or CAE system 100 configured to execute the systems and methods described herein. System 100 includes a processing circuit 102 including a processor 104 and memory 106. The data processing system further includes an input device 120 and display device 122.

Processor 104 may be configured to receive instructions from input device 120. For example, processor 104 may receive instructions to generate a new offset surface or to change the position of the offset surface via one or more controls on the manipulation tool. Processor 104 may be, but is not limited to being, an Intel® designed processor, AMD® designed processor, Apple® designed processor, QUALCOMM® designed processor, or ARM® designed processor.

Memory (or storage device) 106 may include a memory such as a random access memory (RAM) or other dynamic storage devices. In another implementation, memory 106 may also include non-transitory storage media that is configured to store information regarding the simulation model. In one embodiment, memory 106 may be a remote storage device that stores CAD or CAE system 100 data in a different location than CAD or CAE system 100 or input device 120. In another embodiment, memory 106 may be located on the same computer system as CAD or CAE system 100 or input device 120.

Referring more generally to CAD or CAE system 100, various subsystems (shown in memory 106) are included that may be executed to generate and modify offset surfaces as described in the present disclosure. CAD or CAE system 100 may further include various other subsystems not illustrated in the present disclosure for general CAD or CAE system functionality. While the present disclosure describes a CAD or CAE system, it should be understood that CAD or CAE system 100 may alternatively be a computer-aided engineering (CAE) system, finite element method (FEM) system, or any other type of similar system in which a user may perform engineering tasks or create designs via computer software.

Input device 120 may be or include a computer with a monitor, keyboard, keypad, mouse, space ball mouse, touch screen, air gesturing detection device, leap motion device, voice activate input, joystick, or other input devices performing a similar function. Input device 120 may include a keyboard including alphanumeric and other keys, and may be connected to CAD system 100 for communicating information and command selections to processor 104. Input device 120 may include a touch screen interface or movement sensing interface that may be combined with, or separated from, display device 122. Input device 120 may include a cursor control device, such as a mouse, trackball, touch screen, motion sensor, or cursor direction keys, for communicating direction information and command selections to processor 104 and for controlling cursor movement on display device 122. Display device 122 may be any type of display (e.g., CRT display, LCD display, etc.) configured to provide a visual output to a user of CAD system 100 and the data processing system.

Figure 2:
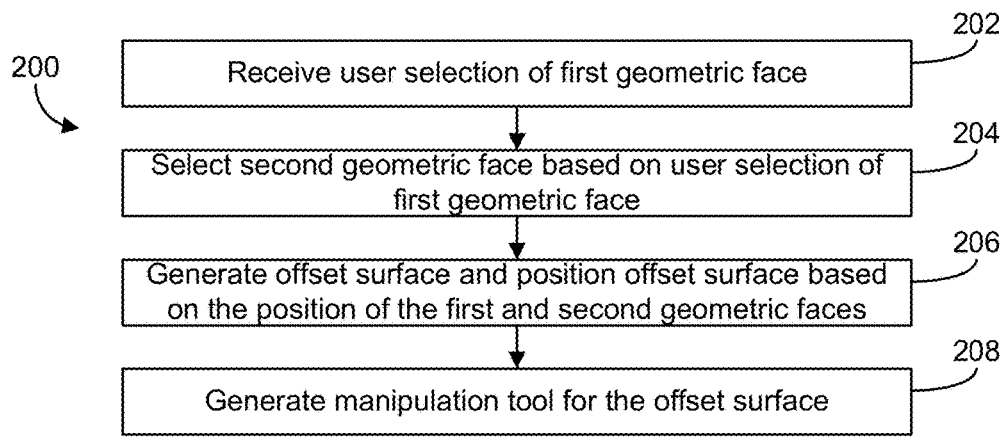
FIG. 2 is a flow chart of a process for generating an offset surface of a simulation model and a manipulation tool for the offset surface, according to an exemplary embodiment.

Memory 106 is shown to include an offset surface generation module 110 and manipulation tool generation module 112. Offset surface generation module 110 is configured to generate an offset surface based on a user-selected first geometric face and a determined second geometric face. Manipulation tool generation module 112 is configured to generate a manipulation tool configured to allow a user to adjust the position of the offset surface. Referring now to FIG. 2, a flow chart of a process 200 for generating an offset surface of a simulation model and a manipulation tool for the offset surface is shown. The activities of modules 110, 112 are described with reference to process 200 below.

Process 200 includes receiving a user selection of a first geometric face in a simulated model (step 202). For example, referring also to FIG. 3A, module 110 may receive the user selection of geometric face 302 via input device 120. The user may select one geometric face or a plurality of related or unrelated geometric faces.

Figure 3A:
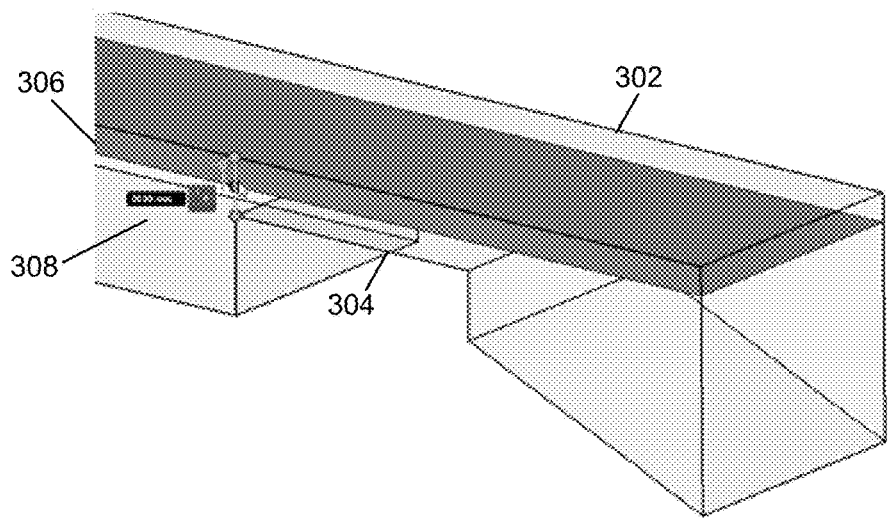
FIGS. 3A-C illustrate an example simulation model with a generated offset surface and manipulation tool, according to an exemplary embodiment.

Process 200 further includes selecting a second geometric face of the simulated model based on the received selection of the first geometric face (step 204). For example, step 204 may include determining the geometric face nearest to the selected geometric face that is opposite to the selected geometric face. Referring also to FIG. 3A, module 110 may select geometric face 304 as the opposing face, being the face closest to geometric face 302 that opposes the face. In other embodiments, step 204 may include selecting any other geometric face based on other logic (e.g., the closest geometric face to the selected geometric face regardless of orientation, the furthest geometric face, a pre-determined geometric face, a most appropriate face based on the simulation model properties, etc.), or a plurality of geometric faces if appropriate.

Process 200 further includes generating an offset surface geometrically similar to the first geometric face (step 206). The position of the offset surface may be based on the position of the first geometric face and second geometric face. For example, the offset surface may be positioned at a midpoint between the two geometric faces. In other embodiments, the offset surface may be positioned at any other point between the geometric faces, or not in between the geometric faces. Referring also to FIG. 3A, offset surface 306 is shown generated at a midpoint between geometric faces 302, 304.

Process 200 further includes generating a manipulation tool (step 208). The manipulation tool is configured to allow a user to change the position of the offset surface relative to the first geometric face and second geometric face. Referring also to FIG. 3A, manipulation tool 308 is shown generated for offset surface 306.

Figure 3B:
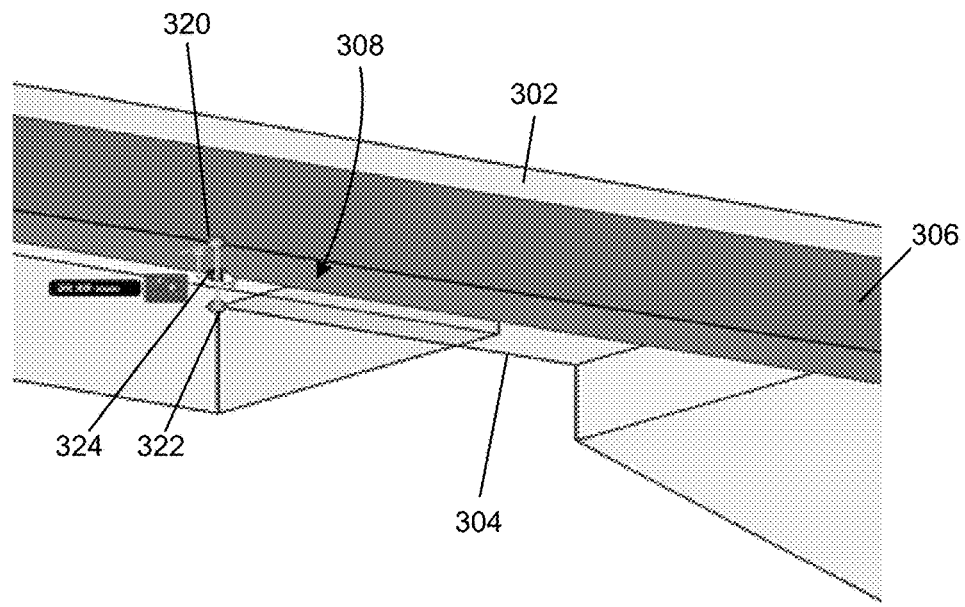

Referring now to FIG. 3B, the manipulation tool 308 generated at step 208 is shown in greater detail. Manipulation tool 308 is shown to include a first end marker 320 and second end marker 322. First end marker 320 may be associated with the first geometric face 302 (e.g., the selected geometric face) and second end marker 322 may be associated with the second geometric face 304. First end marker 320 and second end marker 322 are shown attached or "snapped" to the edges of the first and second geometric face 302, 304. In other embodiments and as shown in subsequent figures, markers 320, 322 may alternatively be attached to a zero dimensional, one dimensional, two dimensional, three dimensional geometries or finite element entity.

Manipulation tool 308 further includes a third marker 324 associated with offset surface 306 and associated to the manipulator and/or the other markers. Manipulation tool 308 is shown to include a single third marker 324 for offset surface 306; in other embodiments more than one marker for offset surface 306 may be generated by module 112. Third marker 324 is shown to be associated to a point on the face of the offset 306; in other embodiments third marker 324 may alternatively be attached to the surface or a vertex of offset surface 306, or may not be attached to offset surface 306 but is still associated with offset surface 306. Third marker 324 and offset surface 306 may be configured such that whenever third marker 324 changes position (either via the user changing the position of third marker 324 or another marker), offset surface 306 is configured to "follow" the position of third marker 324.

Figure 3C:
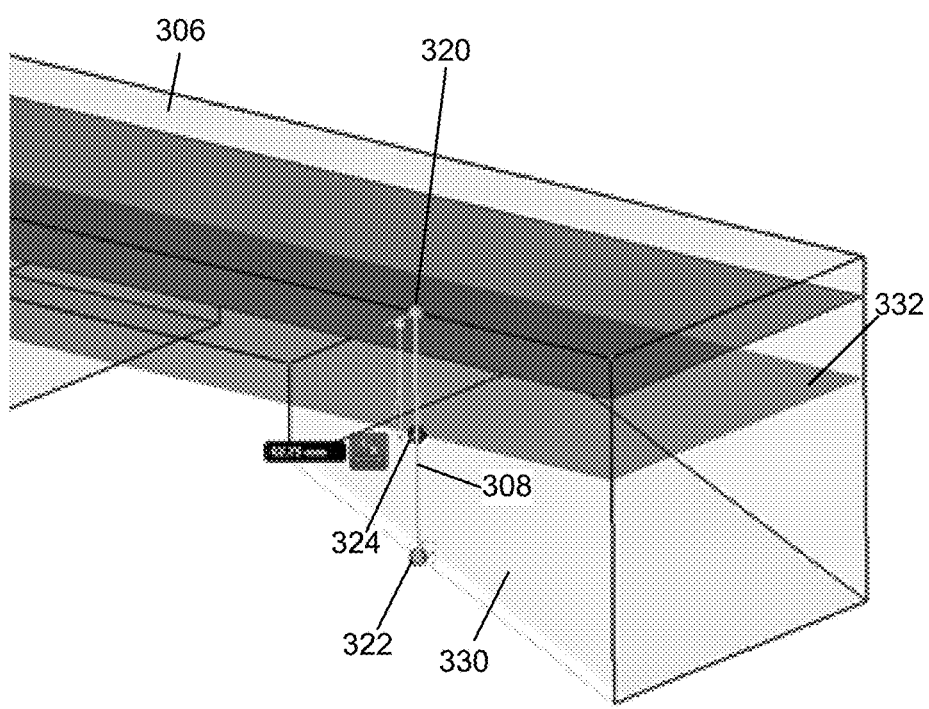

Markers 320, 322, 324 may be selectable by a user of CAD system 100. When a user selects and moves one of markers 320, 322, 324, modules 110, 112 may be used to change the position of offset surface 306 and manipulation tool 308. For example, assume the user selects the first marker 320 associated with first geometric face 302, as shown in FIG. 3C. If the user drags first marker 320 to another edge, vertex, or surface of first geometric face 302, module 112 may be configured to change the position of manipulation tool 308 and its markers 320, 322, 324. In FIG. 3C, the length of manipulation tool 308 increases and the location of third marker 324 changes to accommodate the new position of first marker 320 (e.g., if third marker 324 is supposed to be halfway in between markers 320, 322, the position of third marker 324 automatically adjusts when the position of first marker 320 is changed). In another example, when the user drags the marker 322 to a target entity and 320 moves as a result of the manipulator 308 being moved. The markers may adjust accordingly due to their relationships to the manipulator's length. The adjustment of the marker may adjust the middle marker 324 and thereby causes the offset surface 306 to move with it the manipulator 308. Accordingly, a preview image 332 of the position of offset surface 306 is displayed to correspond with third marker 324. Further, second marker 322 changes position with the rest of manipulation tool and attaches to the edge of another opposing geometric face 330 (i.e., the opposing geometric face changes from one face to another in response to the movement of the first marker 320). As the user drags the marker 322 the manipulator will move or adjust with the movement of the marker 322 while maintaining the perpendicular angle to the original face 302. Therefore if the manipulator's first marker 322 needs to remain on the original face 302 and the manipulator's orientation to needs to remain the same then if user drags marker 322, the manipulator 308 may be forced to move while maintaining the relationship with the markers. In this example, the manipulator may be lengthened to maintain the orientation and relative relationships with the markers. As it extends on length the marker 324 maintains its relationship with the manipulator and with the geometry preview 332 that is associated to the marker 324. Once the user stops dragging and releases the mouse buttons, then the face 306 may change its location to meet its preview 332. Second marker 322 changes position such that the orientation between manipulation tool 308 and first geometric face 302 is maintained.

Referring generally to FIGS. 4-11, various interactions with the manipulation tool and its markers may allow for various changes to be made to the offset surface and manipulation tool. As examples, a user may drag a marker from one geometric face to another, changing the first geometric face or second geometric face associated with the offset surface; the user may change the relationship between the offset surface and the geometric faces using the third marker; or otherwise. It should be understood that the following embodiments shown in FIG. 4-11 are not limiting, and that further modifications are possible based on various combinations of selections and movements as described below.

Figure 4A:
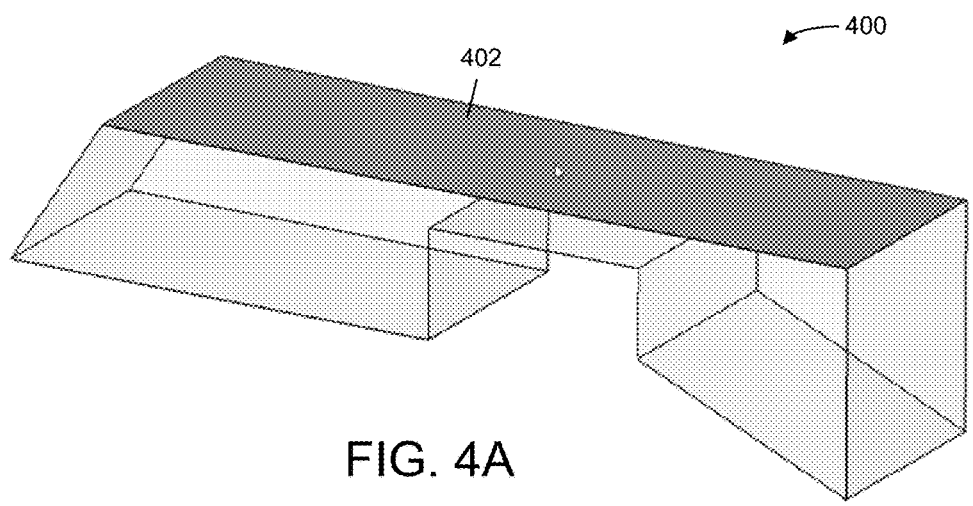
FIGS. 4A-B illustrate a generation of an offset surface and manipulation tool based on a user selection of a geometric face of the simulation model, according to an exemplary embodiment.

Referring to FIG. 4A, a simulation model 400 is shown with a plurality of faces. A geometric face 402 is shown selected by a user. The selection may occur by the user clicking on the geometric face, via a keyboard input, or by any other method via input device 120. The user may hover over a geometric face in simulation model 400 with an input device. The geometric face may then be shaded or otherwise highlighted, identified or indicated, allowing the user to see which geometric face he or she may select.

Figure 4B:
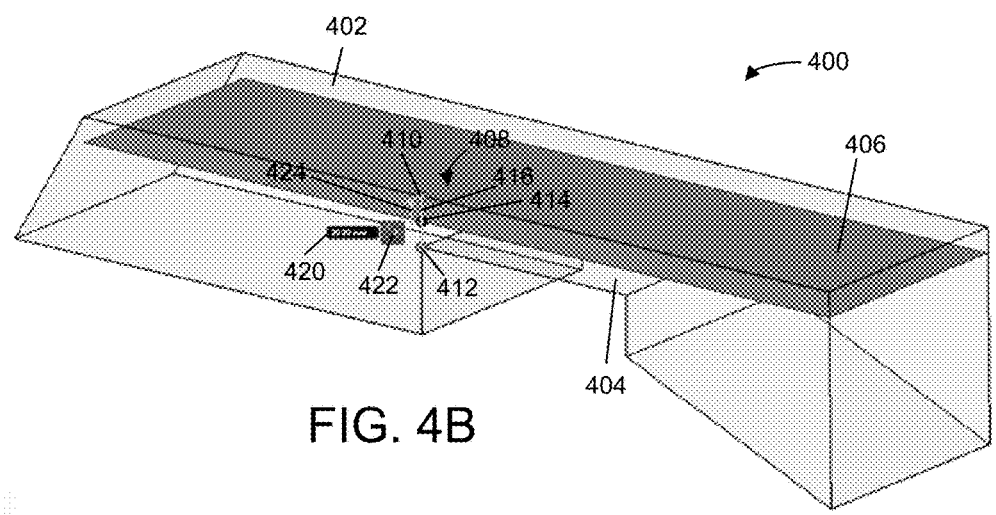

Referring to FIG. 4B, upon selection of geometric face 402 (the first geometric face), an offset surface 406 is generated that is geometrically similar to geometric face 402. Additionally or alternatively, as the user selects the face 402 we also set the rendering of model 400 to a partial transparency or some other form of rendering, lighting, color or any assortment of rendering to allow the user to clearly see the face 406 since this face could be placed inside the simulation model. Offset surface 406 may be shaded or otherwise highlighted, may be partially transparent, etc., to illustrate the surface to the user. Offset surface 406 is placed in a location in space in between geometric face 402 and the most appropriate opposing geometric face 404. In the example of FIG. 4B, the most appropriate opposing geometric face is the closest opposing face; in other embodiments other geometric faces may be chosen.

Further, upon generation of offset surface 406, manipulation tool 408 is generated for offset surface 406. Manipulation tool 408 includes a first interactable end marker 410, associated with the first (original) geometric face 402 selected. Manipulation tool 408 further includes a second interactable end marker 412, associated with the second geometric face 404. Manipulation tool 408 further includes a third interactable marker 414. This marker 414 may be configured to have a particular relationship with manipulation tool 408. For example, as shown, marker 414 may be located midway between the two end markers 410, 412. Offset surface 406 is configured to be located at the location of third marker 414. Manipulation tool 408 further includes a stem 416 configured to always run perpendicular to first geometric face 402. Each of markers 410, 412, 414 are attached to stem 416, and third marker 414 is configured to be moved up or down on stem 416 to change the position of offset surface 406.

Manipulation tool 408 may further include additional components. For example, manipulation tool 408 may include a text box 420. Text box 420 may display, for example, a distance between offset surface 406 and first geometric face 402. In other embodiments, text box 420 may display the distance between geometric faces 402, 404, or may display any other distance between two relevant components of simulation model 400. In one embodiment, a user may type a value into text box 420 to specify a desired distance between offset surface 406 and first geometric face 402. Manipulation tool 408 further includes an icon 422 that indicates the relationship between offset surface 406 and first geometric face 402. For example, icon 422 is shown to include the text "½", indicating that offset surface 406 is located halfway between first geometric face 402 and second geometric face 404. Icon 422 may be selectable, i.e., the user may select icon 422 and choose or enter a different relationship between the surfaces (e.g., ⅓, ⅔, or another distance between the two geometric faces).

Manipulation tool 408 is shown to include arrows 424 depicting the distance between offset surface 406 and first geometric face 402. In other embodiments, manipulation tool may alternatively or additionally include arrows depicting other relevant distances of simulation model 400.

Figure 5A:
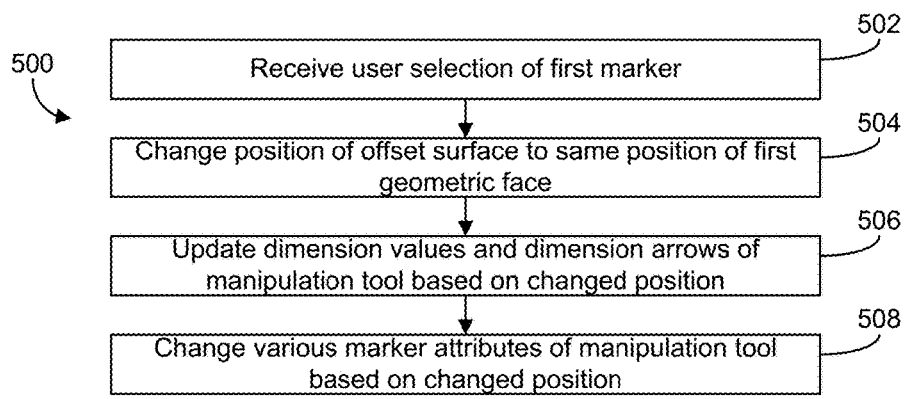
FIGS. 5A-B are a flow chart of a process and accompanying illustration of a user interaction with the first end marker of the manipulation tool, according to an exemplary embodiment.
Figure 5B:
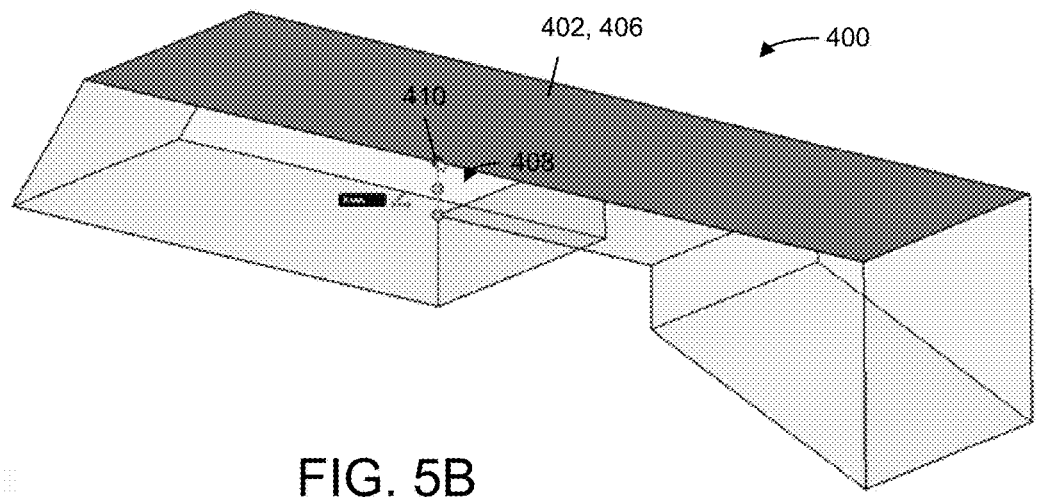

Referring now to FIGS. 5A-B, a flow chart and illustration of a process 500 executed when the user selects first marker 410 is shown. In process 500, the user may wish to move offset surface 406 to the same position as first geometric face 402. Process 500 includes receiving a user selection of first marker 410 (step 502). First marker 410 may be highlighted to indicate the selection of the marker. The user selection may be a single click, a double click, or any other type of user input. For example, a single click of a marker may generally be associated with moving offset surface 406 to the location of the clicked or selected, while a click and drag may generally be associated with moving manipulation tool 408. Therefore, step 502 may include the user single-clicking first marker 410.

Process 500 further includes changing the position of offset surface 406 to the same position of first geometric face 402 (step 504). Process 500 further includes updating the dimension values in text box 420 and adjusting dimension arrows 424 accordingly (step 506). For example, the dimension value is changed to 0. Process 500 further includes changing the various attributes of the markers accordingly (step 508). For example, first marker 410 may remain highlighted to indicate that offset surface 406 was moved to the same position as first geometric face 402, and icon 422 may be changed to provide a visual indication of the change. In various embodiments, other components of manipulation tool 408 may further be changed. In process 500, offset surface 406 is moved from a position associated with third marker 414 to another position, severing the relationship between offset surface 406 and third marker 414 (third marker 414 remains in the same position).

Figure 6A:
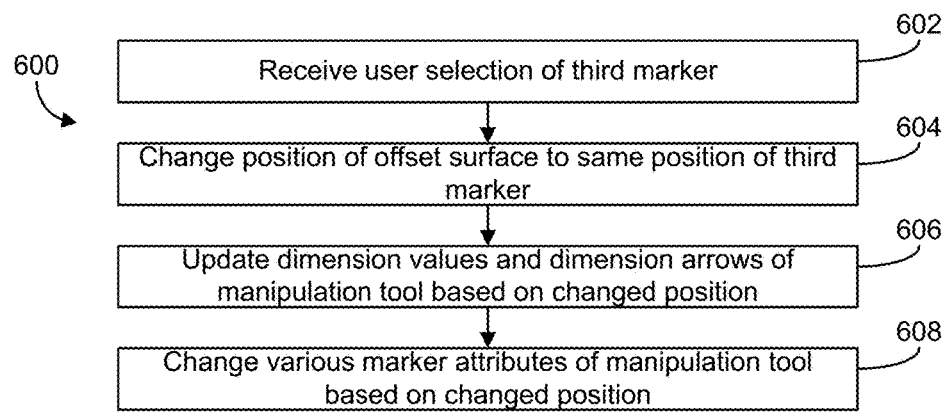
FIGS. 6A-B are a flow chart of a process and accompanying illustration of a user interaction with the middle marker of the manipulation tool, according to an exemplary embodiment.
Figure 6B:
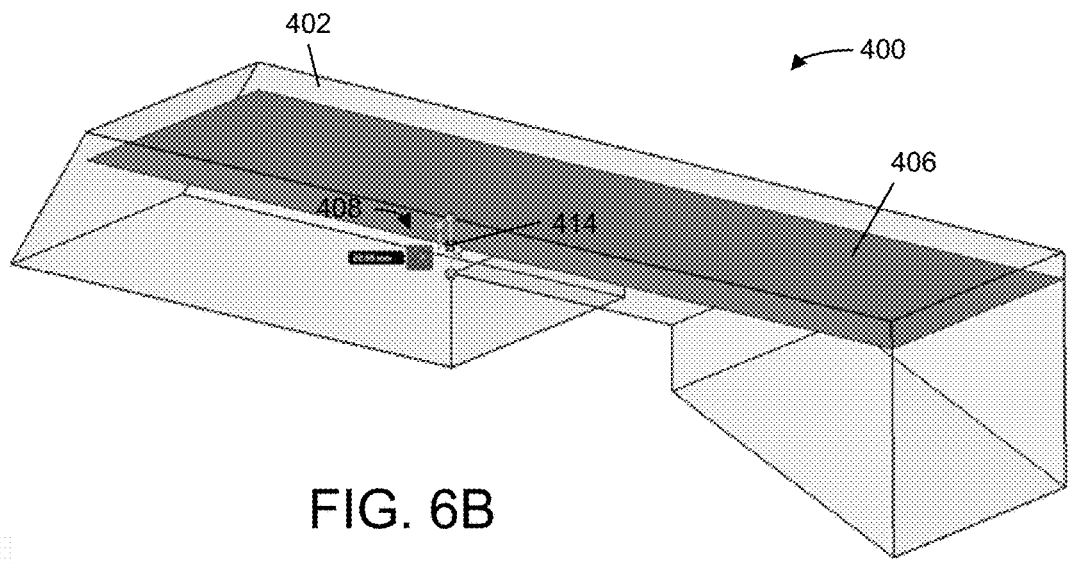

Referring now to FIG. 6AB, a flow chart and illustration of a process 600 executed when the user selects third marker 414 is shown. In process 600, the user may wish to move offset surface from a first position to a position corresponding with third marker 414. For example, as shown in FIG. 6B, offset surface 406 is not associated with third marker 414, as offset surface 406 was moved to another position. In process 600, offset surface 406 is moved back to a position associated with third marker 414.

Process 600 includes receiving a user selection of third marker 414 (step 602). Third marker 414 may be highlighted to indicate the selection of the marker. The user selection may be a single click, a double click, or any other type of user input. For example, a single click of a marker may generally be associated with moving offset surface 406 to the location of the click, while a click and drag may generally be associated with moving manipulation tool 408. Therefore, step 602 may include the user single-clicking third marker 414.

Process 600 further includes changing the position of offset surface 406 to the same position as third marker 414 (step 604). Process 600 further includes updating the dimension values in text box 420 and adjusting dimension arrows 424 accordingly (step 606). For example, the dimension value is changed to the distance between first geometric face 402 and offset surface 406. Process 600 further includes changing the various attributes of the markers accordingly (step 608). For example, third marker 414 may remain highlighted to indicate that offset surface 406 is associated with third marker 414, and icon 422 may be changed to provide a visual indication that offset surface 406 is halfway between geometric faces 402, 404.

The methods described in FIGS. 5A-6B may generally be adapted for other functionality. For example, the single-clicking of any of markers 410, 412, 414 may result in a change in position of offset surface 406 to correspond with the clicked marker. As another example, the user may click any part of manipulation tool 408 or simulation model 400 to cause a change in position of offset surface, or otherwise.

Referring now to FIGS. 7A-D, a flow chart and illustrations of a process 700 executed when the user selects second marker 412 is shown. In process 700, a user may desire to change the position of offset surface 406, and preview the change, via second marker 412. A user may select second marker 412, drag the marker, and snap the end marker to an edge 432 of a new geometric face 430. The user may hold down on the mouse (or other input device) without letting go, as the user moves second marker 412 around. As a result, a "preview" image of offset surface 406 is generated as the user moved around second marker 412, allowing the user to preview a possible move of offset surface 406.

Process 700 includes receiving a user selection of second marker 412 (step 702). The user selection of second marker 412 may be a single click and hold, i.e., the user clicks on second marker 412 and does not let go of the input device, allowing the user to drag second marker 412 around simulation model 400. In other embodiments, the user selection may not be limited to a single click and hold, in other embodiments, similar steps may occur by the user choosing to modify the gesture to some other gesture. Step 702 may include highlighting second marker 412.

Process 700 further includes adjusting manipulator tool 408 based on the user dragging second marker 412 along the edge of new geometric face 430 (step 704). For example, the user may drag second marker 412 to any position on simulation model 400, and manipulator tool 408 is configured to follow second marker 412. Manipulation tool 408 is configured to maintain its perpendicular relation to first geometric face 402. Therefore, the stem of manipulation tool 408 is configured to contract and expand as the position of second marker 412 changes. First marker 410 is kept on the original geometry of first geometric face 402, and may be kept on any face or set of faces contiguous to first geometric face 402, or any other extrapolated faces to face 402 as necessary.

Process 700 further includes maintaining the relationship between third marker 414 associated with offset surface 406 and the other markers and faces (step 706). For example, if third marker 414 is halfway between geometric faces 402, 404, then the relationship should be maintained as second marker 412 is moved around and the stem of manipulation tool 408 contracts and expands. Accordingly, the position of third marker 414 is changed to always be halfway between geometric faces 402, 404.

Further, since offset surface 406 is associated with third marker 414, the position of offset surface 406 should change in real-time with third marker 414. However, since the user is dragging second marker 412 and not placing the marker anywhere yet, offset surface 406 should stay in place until any change is finalized by the user. Therefore, process 700 includes displaying a preview image 434 of the offset surface 406 (step 708). Preview image 434 may be aligned with third marker 414, displaying a preview to the user of how the offset surface would look if the current position of second marker 412 is chosen by the user. Preview image 434 may be shaded or otherwise highlighted in a similar manner to offset surface 406, but slightly differently (e.g., lighter shade, more transparent, etc.) to visually indicate that it is a preview image.

As second marker 412 is moved, dimension text box 420 and dimension arrows 424 are also updated in real time (step 710) to indicate to the user a distance and position between preview image 434 and geometric faces 402, 404.

Figure 7A:
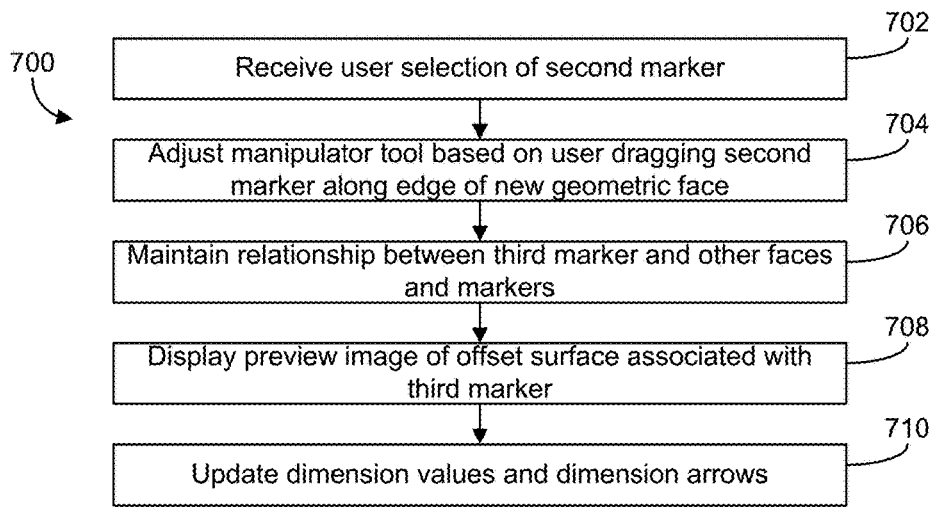
FIGS. 7A-D are a flow chart of a process and accompanying illustration of a user interaction with the second end marker of the manipulation tool, wherein the user drags the second end marker to an edge, according to an exemplary embodiment.
Figure 7B:
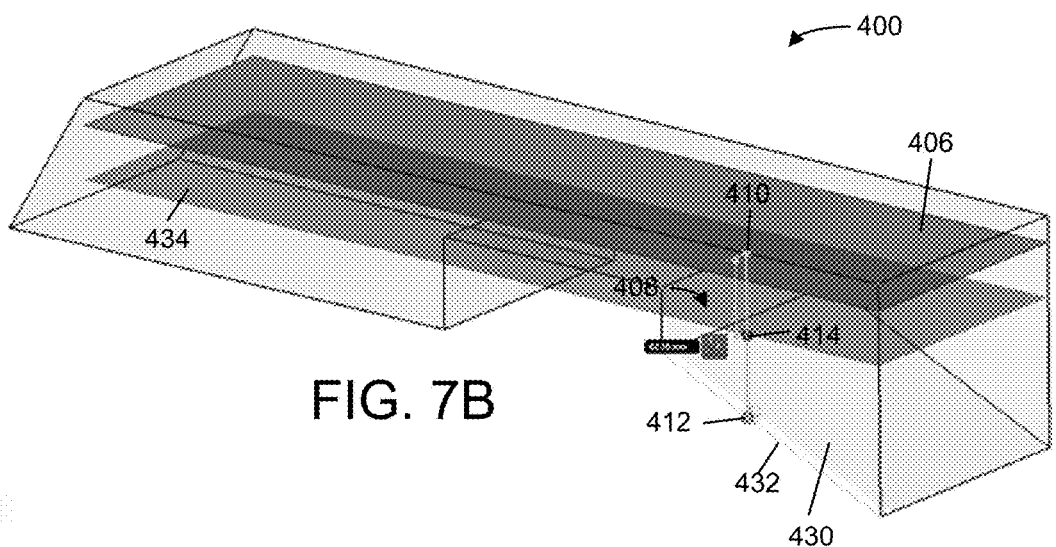
Figure 7C:
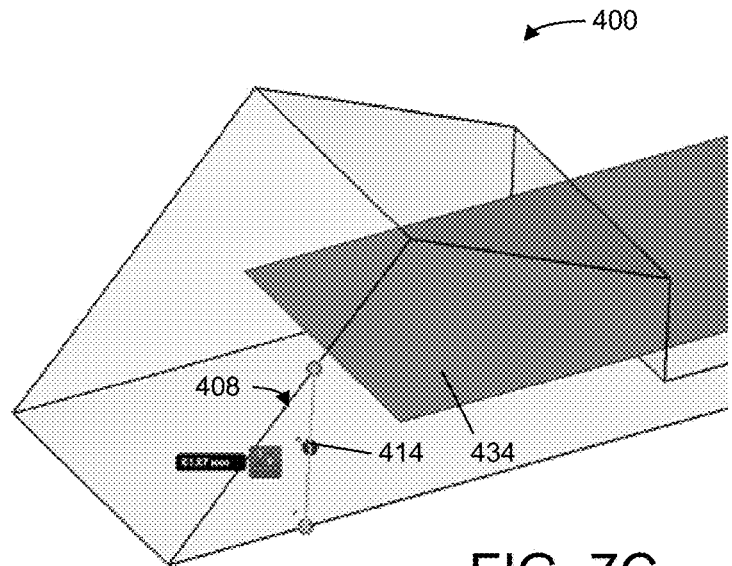

As shown in FIG. 7C, during the process of dragging second marker 412, third marker 414 may need to become detached from preview image 434. For example, because of the dimensions of simulation model, it may not be possible to keep third marker 414 physically attached to preview image 434. In such a case, third marker 414 may not need to be attached to preview image 434 to maintain its association with preview image 434.

Figure 7D:
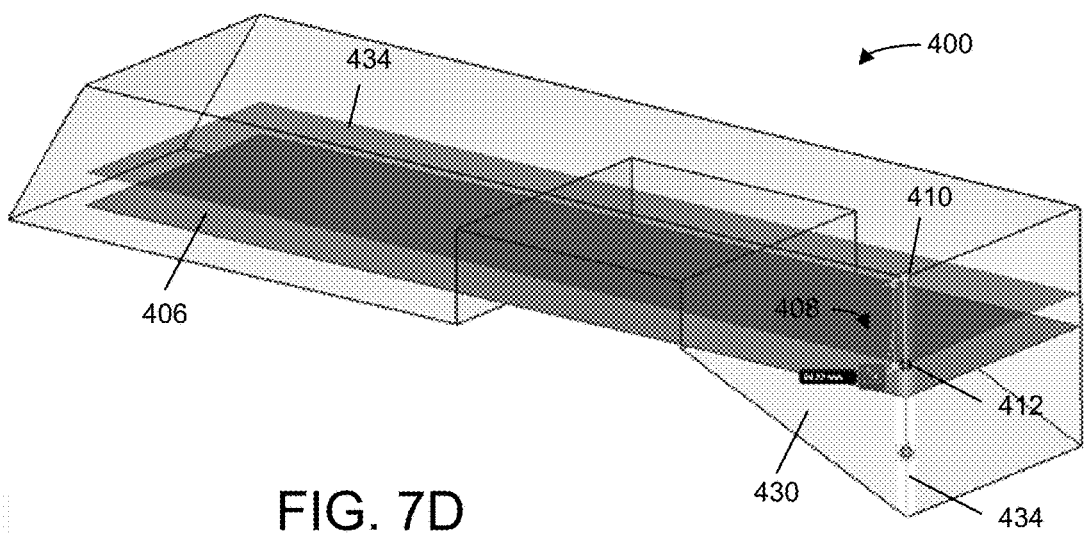

Referring to FIG. 7D, another example of dragging second marker 412 to an edge 432 is shown. In the embodiment of FIG. 7D, edge 432 is perpendicular to first geometric face 402. The user may be able to select any edge, regardless of its relationship with first geometric face 402. The steps of process 700 may be followed for any edge selected by the user.

Figure 8A:
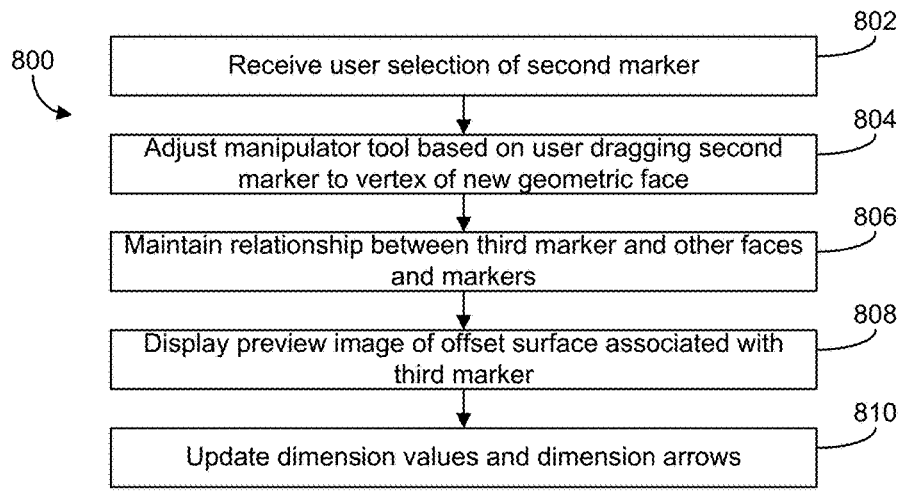
FIGS. 8A-B are a flow chart of a process and accompanying illustration of a user interaction with the second end marker of the manipulation tool, wherein the user drags the second end marker to a vertex, according to an exemplary embodiment.
Figure 8B:
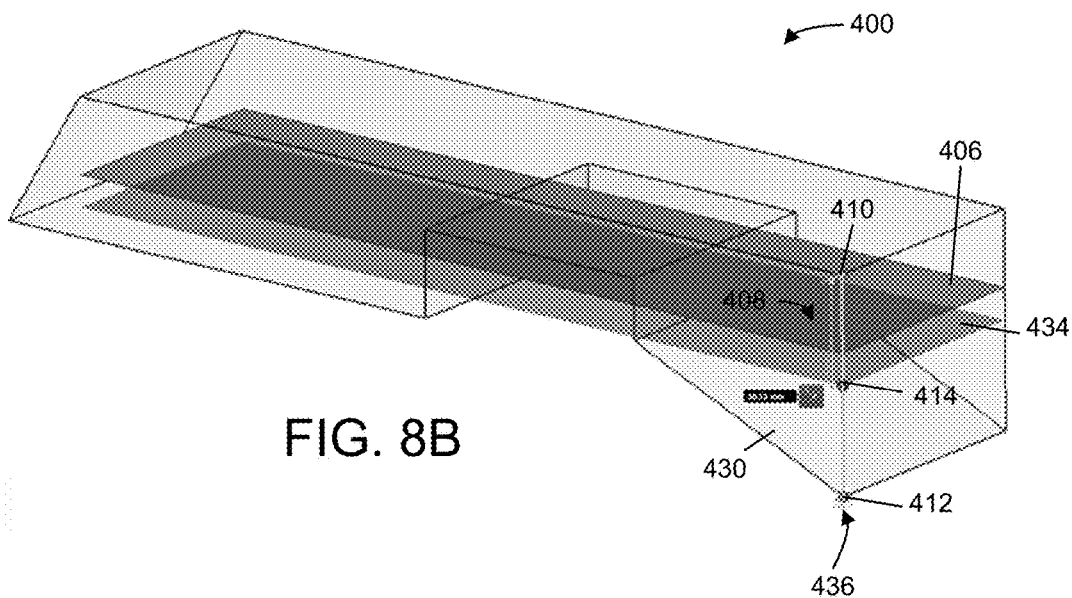

Referring now to FIGS. 8A-B, a flow chart and illustration of a process 800 executed when the user selects second marker 412 is shown, according to another embodiment. Compared to process 700, process 800 is executed as the user drags second marker 412 to a vertex of a geometric face instead of an edge.

Process 800 includes receiving a user selection of second marker 412 (step 802). The user selection of second marker 412 may be a single click and hold, i.e., the user clicks on second marker 412 and does not let go of the input device, allowing the user to drag second marker 412 around simulation model 400. Step 802 may include highlighting second marker 412.

Process 800 further includes adjusting manipulator tool 408 based on the user dragging second marker 412 to a vertex 436 of new geometric face 430 (step 804). For example, the user may drag second marker to vertex 436 and manipulator tool 408 is configured to follow second marker 412 while remaining perpendicular to first geometric face 402. Therefore, the stem of manipulation tool 408 is configured to contract and expand as the position of second marker 412 changes. First marker 410 is kept on the original geometry of first geometric face 402, and may be kept on any face or set of faces contiguous to first geometric face 402, or any other extrapolated faces to face 402 as necessary.

Process 800 further includes maintaining the relationship between third marker 414 associated with offset surface 406 and the other markers and faces (step 806). Further, a preview image 434 of offset surface 406 is displayed (step 808) and dimension text box 420 and dimension arrows 424 are updated in real time (step 810). Steps 806-810 may generally correspond with steps 706-710 of process 700.

Figure 9A:
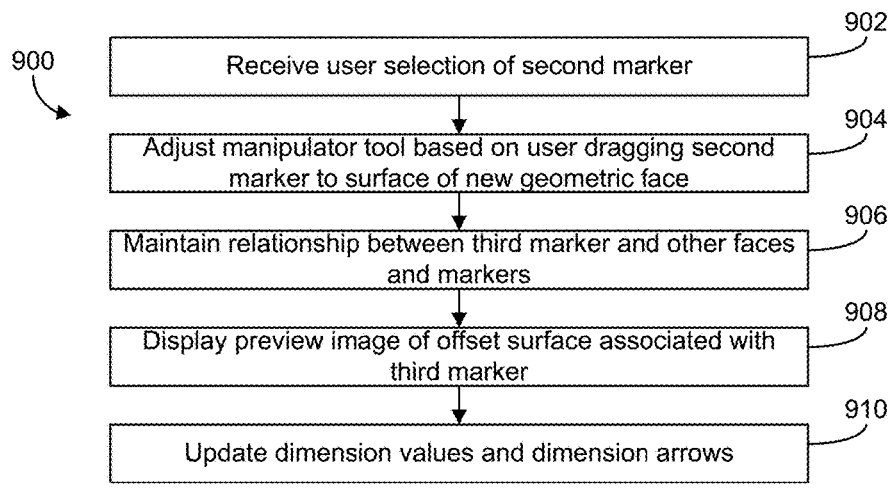
FIGS. 9A-B are a flow chart of a process and accompanying illustration of a user interaction with the second end marker of the manipulation tool, wherein the user drags the second end marker to a surface, according to an exemplary embodiment.
Figure 9B:
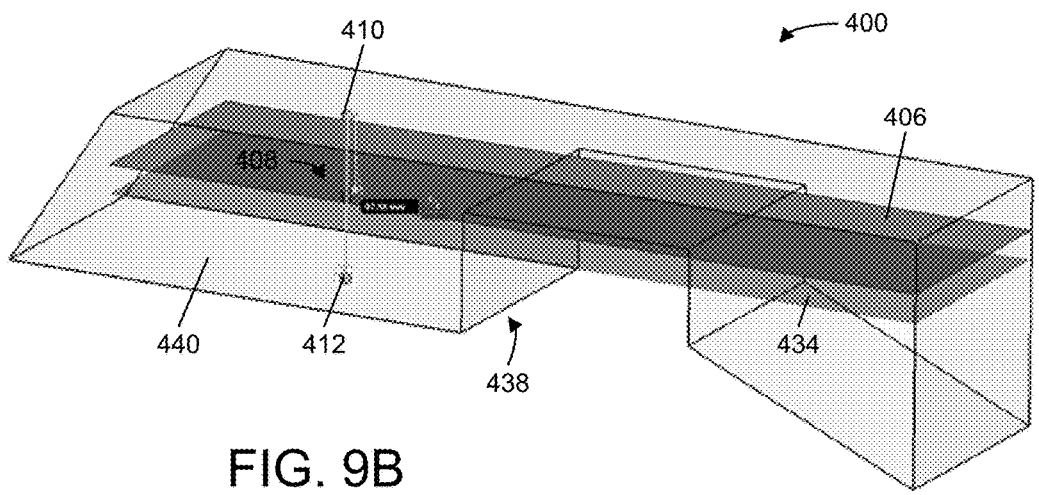

Referring now to FIGS. 9A-B, a flow chart and illustration of a process 900 executed when the user selects second marker 412 is shown, according to another embodiment. Compared to process 700 and 800, process 900 is executed as the user drags second marker 412 to a surface of a geometric face instead of an edge or vertex.

Process 900 includes receiving a user selection of second marker 412 (step 902). The user selection of second marker 412 may be a single click and hold, i.e., the user clicks on second marker 412 and does not let go of the input device, allowing the user to drag second marker 412 around simulation model 400. Step 902 may include highlighting second marker 412.

Process 900 further includes adjusting manipulator tool 408 based on the user dragging second marker 412 to a surface 440 or a point like location on the surface 440 of new geometric face 438 (step 904). For example, the user may drag second marker to surface 440 and manipulator tool 408 is configured to follow second marker 412 while remaining perpendicular to first geometric face 402. Therefore, the stem of manipulation tool 408 is configured to contract and expand as the position of second marker 412 changes. First marker 410 is kept on the original geometry of first geometric face 402, and may be kept on any face or set of faces contiguous to first geometric face 402, or any other extrapolated faces to face 402 as necessary.

Process 900 further includes maintaining the relationship between third marker 414 associated with offset surface 406 and the other markers and faces (step 906). Further, a preview image 434 of offset surface 406 is displayed (step 908) and dimension text box 420 and dimension arrows 424 are updated in real time (step 910). Steps 906-910 may generally correspond with steps 706-710 of process 700.

Figure 10:
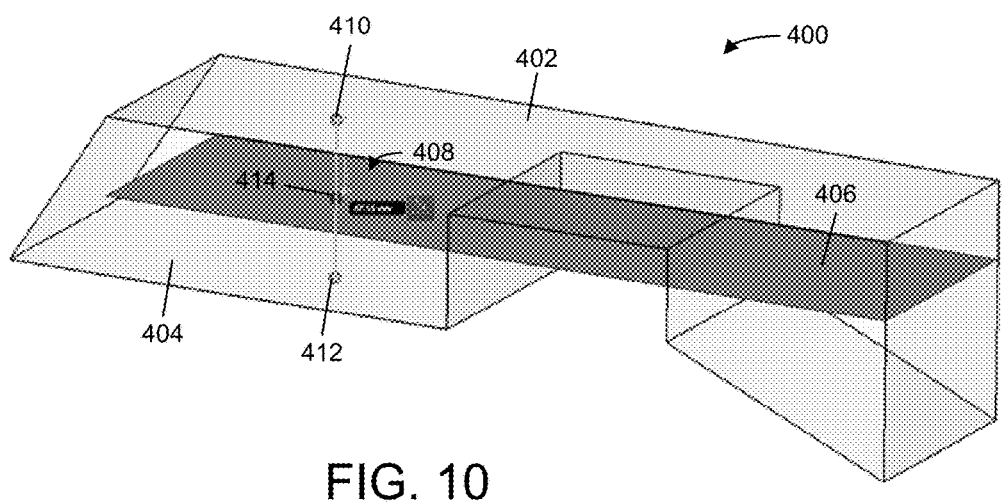
FIG. 10 illustrates an end result of a process of moving a position of an offset surface via moving the second end marker, according to an exemplary embodiment.

Referring generally to FIGS. 7A-9B, various methods of user interaction with the simulation model are described, with relation to a user dragging a marker of the manipulation tool to various locations on the simulation model, without the user "letting go" or otherwise selecting a new location for the marker of the manipulation tool. Referring now to FIG. 10, a user may select the new location (e.g., by letting go of the mouse button or other user interface). As shown, second marker 412 is moved to a new second geometric face 404 (and more particularly the surface of face 404) of simulation model 400. Accordingly, first marker 410 has changed location on first geometric face 402 such that manipulation tool 408 remains perpendicular to face 402.

Further, the position of third marker 414 is changed, to maintain a distance halfway between first marker 410 and second marker 412. The position of offset surface 406 is changed to correspond with the new location of third marker 414. Since the user is finished dragging second marker 412, there is no more preview image displayed.

It should be understood that the embodiments described in FIGS. 7A-10 may be implemented for a marker other than second marker 412 (e.g., the user may select and drag any of the markers of manipulation tool 408 to cause a change in the position of manipulation tool 408 and offset surface 406).

Figure 11A:
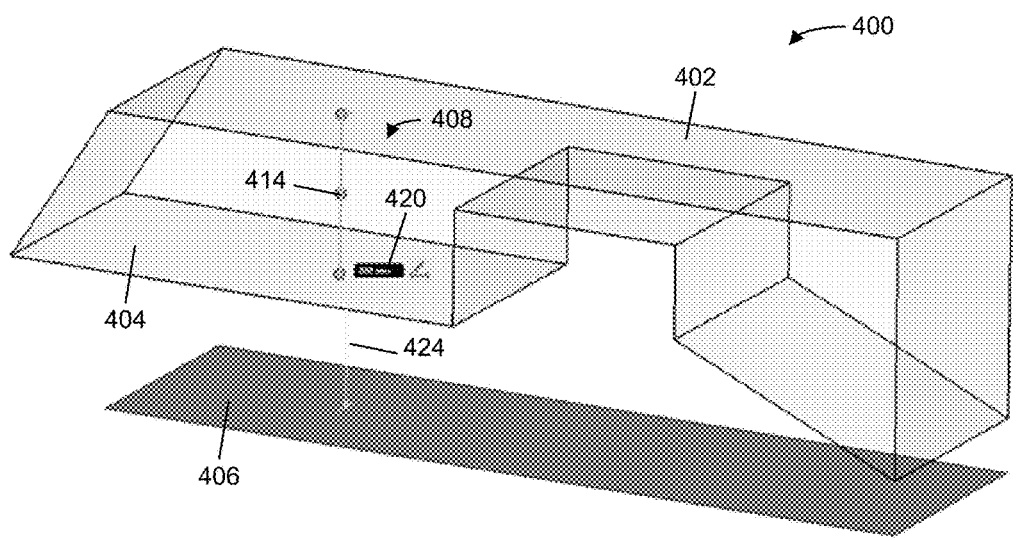
FIGS. 11A-E illustrate various features of the manipulation tool that allow a user to change the position of the offset surface, according to exemplary embodiments.

Referring generally to FIGS. 11A-E, various user interactions with simulation model 400 are illustrated that allow the user to further change the position of offset surface 406 or manipulation tool 408. Referring to FIG. 11A, the user may choose to enter a value in text box 420. The value may represent a distance between two markers of manipulation tool 408. When the value is entered by the user, the position of offset surface 406 is changed to correspond with the difference.

However, if the distance entered is greater than the distance between geometric faces 402, 404 (e.g., the distance is greater than the length of the stem of manipulator tool 408), this may result in offset surface 406 being rendered outside the boundaries of simulation model 400, as shown in FIG. 4A. In this example, offset surface 406 is moved to the new position, and third marker 414 is disassociated with offset surface 406. Text box 420 and arrows 424 are updated with the new distance, and manipulator tool 408 is configured not to change as a result.

Figure 11B:
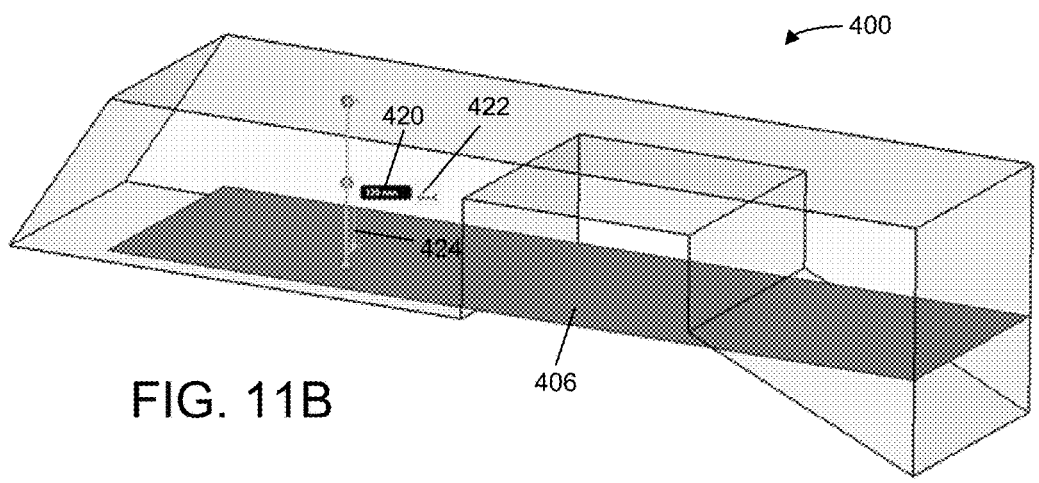

Referring now to FIG. 11B, the user may select icon 422. By selecting icon 422, when icon 422 is displaying "½", offset surface 406 is configured to change position such that offset surface 406 is located halfway between first geometric face 402 and the previous position of offset surface 406. For example, comparing FIG. 11A to FIG. 11B, the distance between first geometric face 402 and offset surface 406 is halved from 250 mm to 125 mm. Text box 420 and arrows 424 are updated with the new position.

Figure 11C:
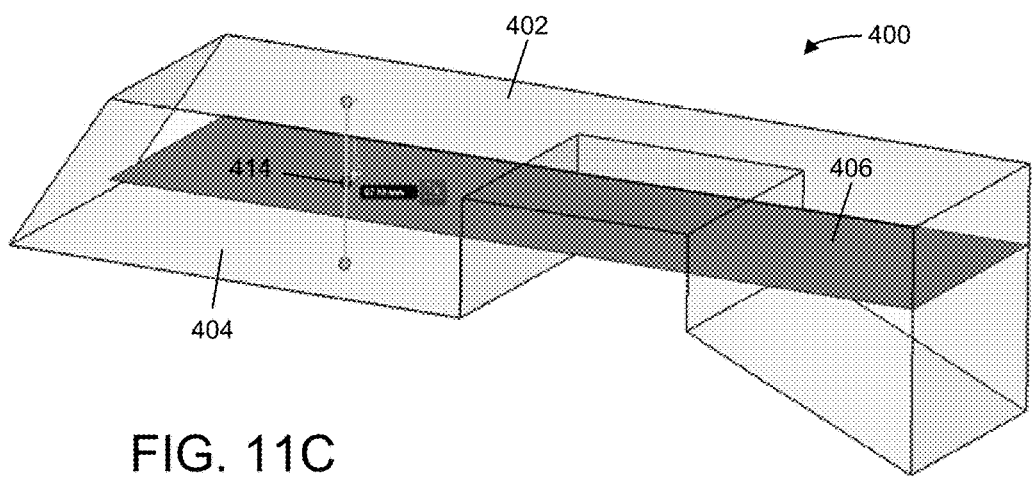

Referring to FIG. 11C, the user clicks on third marker 414. This returns offset surface 406 to a position halfway between faces 402 and 404, and re-associates third marker 414 with offset surface 406, causing the changes to offset surface 406 in FIGS. 11A-B to be disregarded.

Figure 11D:
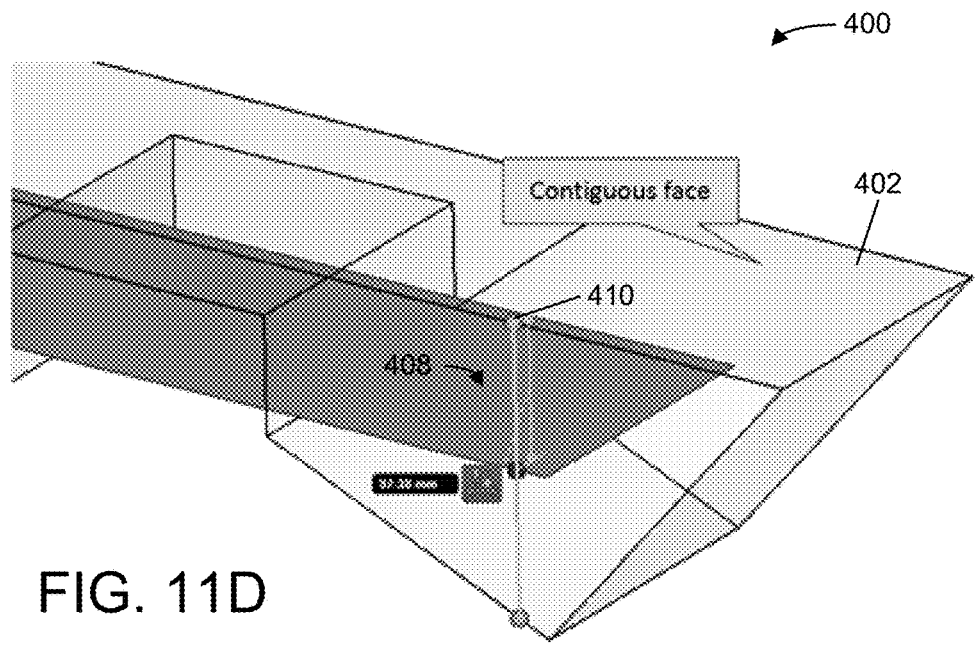
Figure 11E:
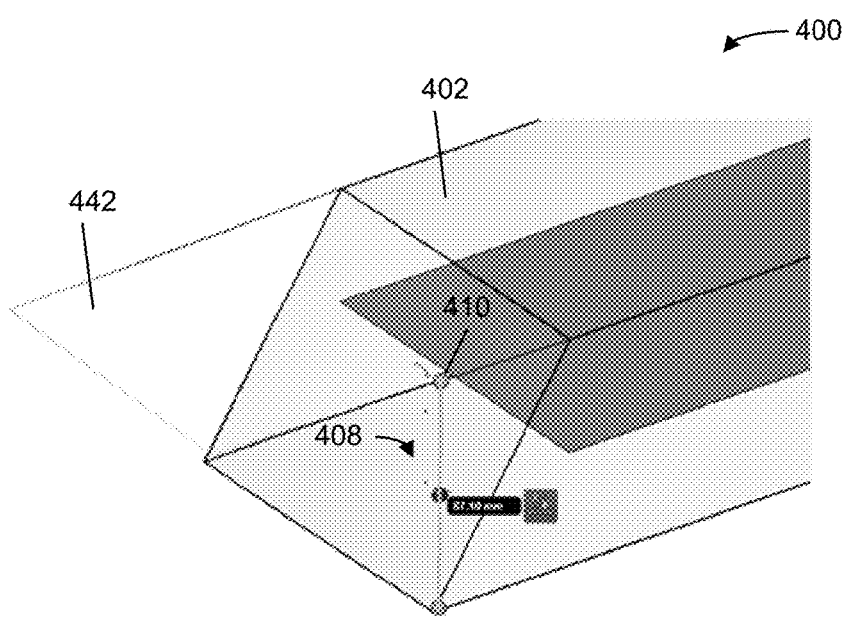

Referring to FIG. 11D, the user may be able to drag manipulation tool 408 to an edge of simulation model 400. In FIG. 11D, first marker 410 is shown to travel across first geometric face 402. In various embodiments, there may be two faces that created out of splitting face 402 into two faces (402a and 402b). Accordingly, the first market is shown to travel across from face 402a to 402b and is not hindered by the edge split between the two faces. In FIG. 11E, when the user drags manipulation tool 408 to an edge such that first marker 410 can no longer traverse across first geometric face 402, first marker 410 is then configured to travel across an extrapolation 442 of first geometric face 402. As shown in FIG. 11E, extrapolation 442 is generated by the CAD system to visually indicate to the user that first marker 410 is still associated with first geometric face 402.

In the various embodiments described herein, any portion of the simulation model, offset surface, or manipulation tool may be displayed in various ways. For example, the offset surface may be partially transparent to help not obscure the view of the simulation model, various markers of the manipulation tool and surfaces of the simulation model may be highlighted to indicate when it is selected by a user, or otherwise. As another example, the offset surface and/or manipulation tool may be selected or de-selected such that the manipulation tool is hidden when the offset surface is not selected or highlighted by a user, or the offset surface itself may be hidden from view by a user. It should be understood such possible variations of display are within the scope of the present disclosure.

Configurations of Various Exemplary Embodiments

The terms "system", "logic", "data processing apparatus" or "computing device" encompasses all kinds of circuits, apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, networked systems or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. The machine-executable instructions may be executed on any type of computing device (e.g., computer, laptop, etc.) or may be embedded on any type of electronic device (e.g., a portable storage device such as a flash drive, etc.).

Although the figures may show a specific order of method steps, the order of the steps may differ from what is depicted. Also, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A method, comprising:
    receiving a user selection of a first object of a simulated model, wherein the first object is a first surface of the simulated model;
    selecting a second object of the simulated model based on the second object being opposed to the received selection of the first object, wherein the second object is a second surface of the simulated model;
    generating an offset object similar to the first object, wherein a position of the offset object is based on positions of the first object and second object; and
    generating a manipulation tool configured to allow a user to change the position of the offset object relative to the first object and second object.

2. The method of claim 1, wherein the second object is determined based on its relationship with the first object.

3. The method of claim 2, wherein the second object is an opposing object that is part of the simulated model nearest to the first object.

4. The method of claim 1, wherein the first object comprises one or more geometric objects; wherein the second object comprises one or more geometric objects; wherein the offset object comprises one or more geometric objects.

5. The method of claim 1, wherein the offset object is generated a distance away from the first object; and
    wherein the manipulation tool is configured to maintain an orientation relative to the first object and the offset object.

6. The method of claim 1, wherein the manipulation tool comprises:
    a first marker associated with the first object;
    a second marker associated with the second object;
    one or more third markers associated with the offset object;
    wherein the first marker is aligned with the first object and the second marker is aligned with the second object, and the first marker and the second marker are controllable to adjust the position or length of the manipulation tool; and
    wherein the first marker, second marker and one or more third markers, are controllable to adjust the position of the offset object, and wherein the one or more third markers may or may not be aligned or associated with the offset object.

7. The method of claim 6, wherein the offset object is configured to be associable with the first, second or third markers; and
    further comprising, moving the offset object, responsive to moving the manipulation tool or changing the length of the manipulation tool and the first, second or third markers configured to maintain their relationship relative to the manipulation tool as the offset object is moved or the position or the length of the manipulation tool is altered.

8. The method of claim 6, wherein the offset object is associable with the first, second or third markers by the user selecting at least one of the first, second or third markers or by a processing circuit configured to associate the offset object with the first, second or third marker based on an algorithm.

9. The method of claim 6, further comprising realigning the first marker, second marker or one or more third markers to be aligned with a zero dimensional entity, one dimensional entity, two dimensional entity, or three dimensional entity or another representative of another object.

10. The method of claim 6, further comprising:
receiving another user selection of a third marker, the another user selection comprising a change in position of the third marker; and
changing the position of the offset object based on the another user selection;
wherein the position or length of the manipulation tool or the location of the first marker, second marker or the third marker on the manipulation tool change based on the another user selection.

11. The method of claim 6, further comprising:
receiving a user input value; and
changing the position of the offset object based on the user input value;
wherein the user input value relates to a distance of the offset object from the first object or second object.

12. The method of claim 6, further comprising:
receiving a user selection includes allowing the user to select at least one of a zero dimensional entity, one dimensional entity, two dimensional entity or three dimensional entity or another entity.

13. The method of claim 6, further comprising:
receiving another user selection of the first marker or second marker; and
changing the location of the manipulation tool based on the another user selection;
wherein the another user selection comprises changing a location of the first marker or second marker from a one dimensional entity, two dimensional entity, three dimensional entity or another representative of the first or second object to a one dimensional entity, two dimensional entity, three dimensional entity or another representative of a new object of the simulation model.

14. The method of claim 6, further comprising:
receiving another user selection of the first marker; and
changing the offset object or the position of the offset object, based on the another user selection;
wherein the another user selection comprises a selection of a new entity different from the first object by receiving user input to drag the first marker from a one dimensional entity, two dimensional entity, three dimensional entity or another representative of the first or second object to a one dimensional entity, two dimensional entity, three dimensional entity or another representative of a new object of the simulation model; and
wherein changing the offset object comprises changing a location or an orientation of the offset object or changing the offset object.

15. The method of claim 6, further comprising:
receiving another user selection of the second marker; and
changing the offset object or the position of the offset object;
wherein the another user selection comprises a selection of a new object different from the second object by the user dragging the second marker from a one dimensional entity, two dimensional entity, three dimensional entity or another representative of the first or second object to a one dimensional entity, two dimensional entity, three dimensional entity or another representative of a new object of the simulation model;
wherein changing the offset object comprises changing a location or an orientation of the offset object or changing the offset object.

16. The method of claim 6, wherein the third marker moves in relation to at least one of the manipulation tool, second marker and/or the first marker.

17. A system, comprising:
a processing circuit configured to:
receive a user selection of a first object in a simulated model, wherein the first object is a first surface of the simulated model;
select a second object of the simulated model based on the second object being opposed to the received selection of the first object, wherein the second object is a second surface of the simulated model;
generate an offset object that is similar to the first object, wherein a position of the offset object is based on positions of the first object and second object; and
generate a manipulation tool configured to allow a user to change the position of the offset object relative to the first object and second object.

18. The system of claim 17, wherein the offset object is generated at a distance away from the first object; and
wherein the manipulation tool is configured to maintain an orientation relative to the first object and the offset object.

19. The system of claim 17, wherein the manipulation tool comprises:
a first marker associated with the first object;
a second marker associated with the second object;
one or more third markers associated with the offset object;
wherein the first marker is aligned with the first object and the second marker is aligned with the second object, and the first marker and the second marker are controllable to adjust the position or length of the manipulation tool; and
wherein the first marker, second marker and one or more third markers, are controllable to adjust the position of the offset object, and wherein the one or more third markers may or may not be aligned or associated with the offset object.

20. The system of claim 19, wherein the offset object is configured to be associable with the first, second or third markers; and
further comprising, moving the offset object, responsive to moving the manipulation tool or changing the length of the manipulation tool and the first, second or third markers configured to maintain their relationship relative to the manipulation tool as the offset object is moved or the position or the length of the manipulation tool is altered.

21. The system of claim 19, wherein the processing circuit is configured to:
receive another user selection of the first marker; and
change the offset object or the position of the offset object, based on the another user selection;
wherein the another user selection comprises a selection of a new entity different from the first object by receiving user input to drag the first marker from a one dimensional entity, two dimensional entity, three dimensional entity or another representative of the first or second object to a one dimensional entity, two dimensional entity, three dimensional entity or another representative of a new object of the simulation model; and wherein change the offset object comprises changing a location or an orientation of the offset object or changing the offset object.

22. The system of claim 19, wherein the processing circuit is configured to:
receive another user selection of the second marker; and
change the offset object or the position of the offset object;
wherein the another user selection comprises a selection of a new object different from the second object by the user dragging the second marker from a one dimensional entity, two dimensional entity, three dimensional entity or another representative of the first or second object to a one dimensional entity, two dimensional entity, three dimensional entity or another representative of a new object of the simulation model;
wherein change the offset object comprises changing a location or an orientation of the offset object or changing the offset object.

* * * * *